United States Patent

Aoai

[11] Patent Number: 5,320,928
[45] Date of Patent: Jun. 14, 1994

[54] PHOTOSENSITIVE COMPOSITION COMPRISING A DIAZONIUM COMPOUND AND A POLYURETHANE

[75] Inventor: Toshiaki Aoai, Shizuoka, Japan

[73] Assignee: Fuji Photo Film Co., Ltd., Minami-Ashigara, Japan

[21] Appl. No.: 755,617

[22] Filed: Sep. 5, 1991

[51] Int. Cl.⁵ .................. G03F 7/021; G03C 1/77
[52] U.S. Cl. ...................... 430/157; 430/175; 430/176; 430/302; 430/906; 522/32
[58] Field of Search .......... 430/176, 906, 175, 157, 430/302; 522/62, 97, 171, 32

[56] References Cited

U.S. PATENT DOCUMENTS

| | | | |
|---|---|---|---|
| 3,607,289 | 9/1971 | Keberle et al. | 96/114 |
| 3,660,097 | 5/1972 | Mainthia | 96/91 |
| 3,754,972 | 8/1973 | de Majistre et al. | 117/72 |
| 3,867,147 | 2/1975 | Teuscher | 430/176 |
| 3,867,351 | 2/1975 | Juna et al. | 260/77.5 |
| 4,289,838 | 9/1981 | Rowe et al. | 430/163 |
| 4,337,307 | 6/1982 | Neubauer | 430/157 |
| 4,408,532 | 10/1983 | Incremona | 430/175 |
| 4,544,466 | 10/1985 | Lindstrom | 430/176 |
| 4,732,840 | 3/1988 | Hasegawa | 430/302 |
| 4,801,527 | 1/1989 | Takamiya et al. | 430/302 |
| 4,822,715 | 4/1989 | Shoji et al. | 430/302 |
| 4,840,868 | 6/1989 | Pawlowski et al. | 430/176 |
| 4,859,562 | 8/1989 | Pawlowski et al. | 430/175 |
| 4,877,711 | 10/1989 | Aoai et al. | 430/176 |
| 4,950,582 | 8/1990 | Aoai et al. | 430/175 |
| 4,963,693 | 10/1990 | Sato et al. | 528/72 |
| 4,983,491 | 1/1991 | Aoai et al. | 430/176 |
| 5,112,743 | 5/1992 | Kamiya et al. | 430/175 |
| 5,187,040 | 2/1993 | Mueller-Hess et al. | 430/176 |
| 5,254,432 | 10/1993 | Aoai | 430/192 |

Primary Examiner—Charles L. Bowers, Jr.
Assistant Examiner—John S. Chu
Attorney, Agent, or Firm—Burns, Doane, Swecker & Mathis

[57] ABSTRACT

A photosensitive composition comprising a sensitizing amount of light-sensitive diazonium compound and a polyurethane resin binder in an amount sufficient to improve physical property of the composition, wherein said polyurethane resin has at least one group selected from a phosphonic acid group, a phosphoric acid group and ester groups thereof in an amount sufficient to improve adhesion to a support. The photosensitive composition of the present invention provides an excellent adhesion to a support, an excellent developability with an aqueous alkali developer, and a high printing durability.

16 Claims, No Drawings

PHOTOSENSITIVE COMPOSITION COMPRISING A DIAZONIUM COMPOUND AND A POLYURETHANE

BACKGROUND OF THE INVENTION

1. Field of the Invention

The present invention relates to a photosensitive composition. More particularly, it relates to a photosensitive composition exhibiting excellent adhesion to a support and suitable for a presensitized lithographic printing plate (hereinafter referred to as "PS plate") which is developable with an aqueous alkaline developer and capable of providing a lithographic printing plate showing excellent durability.

2. Prior Art

Most of the photosensitive substances used in presensitized printing materials are diazonium compounds and most commonly used are diazo resins such as a condensate of p-diazodiphenylamine and formaldehyde.

The photosensitive composition comprising diazo resins for producing photosensitive layers of PS plates can be divided into two groups, one of which simply comprises diazo resins, in other words those free of binders as disclosed in U.S. Pat. No. 2,714,066 and the other of which comprises both diazo resins and binders as disclosed in U.S. Pat. No. 4,275,138. However, recently, most of the photosensitive layers of PS plates comprise diazonium compounds and polymers serving as the binder in order to improve physical properties such as printing durability, oleophilicity etc. of the plate.

As such a photosensitive layer, there have been known so-called alkali-developable ones whose unexposed portion is removed (or developed) with an aqueous alkaline developer as described in U.S. Pat. No. 4,275,138 and so-called solvent-developable ones whose unexposed portion is removed (or developed) with an organic solvent type developer, but the former has become of major interest recently from the viewpoint of safety in operations and health of operators. Such development types of the light-sensitive layer are determined principally depending on properties of binders used. As a method for making binders alkali-soluble, there have been known a method as disclosed in U.S. Pat. No. 4,123,276 which comprises copolymerizing carboxyl group-containing monomers to obtain such a binder and a method as disclosed in U.S. Pat. No. 2,861,058 which comprises reacting hydroxyl groups of polyvinyl alcohol with a cyclic acid anhydride such as phthalic anhydride to introduce carboxyl groups into the resultant polymers. However, the polymers obtained by these method generally exhibit poor abrasion resistance due to the chemical structures thereof, and therefore the lithographic printing plates containing those binder polymers in the photosensitive layer thereof show poor printing durability. By using polyvinyl acetal, it is possible to form a strong coating showing good abrasion resistance; however, this polymer has also a drawback that it can give only the organic solvent developable PS plate.

On the other hand, polyurethane resins have been known as a polymer having excellent abrasion resistance. Combinations of diazonium compounds with substantially linear polyurethane resins and combinations of polycondensates of diazonium salts with branched polyurethane resins are described in U.S. Pat. Nos. 3,660,097 and 4,337,307. However, these polyurethane resins have no alkali-soluble group essentially and therefore has an insufficient solubility in an aqueous alkali developer. It is thus quite difficult to conduct the development in such a manner that the photosensitive layer can be completely removed from the non-image area (exposed area).

Further, combinations of diazonium compounds and polyurethane resins having a carboxyl group are disclosed in U.S. Pat. No. 4,983,491. Although they are soluble in the aqueous alkaline developer and have an excellent abrasion resistance, the adhesion thereof to an aluminum support is not always sufficient. Therefore, there has been problems, for example, the photosensitive layer is sometimes peeled off from the support depending on the storage conditions.

SUMMARY OF THE INVENTION

Therefore, the object of the present invention is to provide a new photosensitive composition showing an excellent adhesion to a support on which the composition is applied and excellent developability with an aqueous alkali developer as well as high printing durability when it is used in producing a printing plate.

After intensive investigations made for the purpose of attaining the above-described object, the inventors have found out that the object can be attained by a new photosensitive composition comprising a diazonium compound and a polyurethane resin having a phosphonic acid group, a phosphoric acid group and/or an ester group of these acid groups. The present invention has been completed on the basis of this finding.

Therefore, the present invention provides a new photosensitive composition comprising a sensitizing amount of light-sensitive diazonium compound and a polyurethane resin binder in an amount sufficient to improve physical property of the composition, wherein said polyurethane resin has at least one group selected from a phosphonic acid group, a phosphoric acid group, a phosphonic acid ester group and a phosphoric acid ester group in an amount sufficient to improve adhesion to a support.

DETAILED DESCRIPTION OF THE PREFERRED EMBODIMENTS

The present invention will be hereunder described in more detail.

Example of the diazonium compound herein used are diazonium compounds as disclosed in U.S. Pat. No. 3,867,147 and diazonium compounds disclosed in U.S. Pat. No. 2,632,703 and particularly preferred are diazo resins such as a condensate of an aromatic diazonium salt and, for instance, an active carbonyl group-containing compound such as formaldehyde. Examples of preferred diazo resins are hexafluorophosphate, tetrafluoroborate and phosphate of a condensate of p-diazodiphenylamine and folmaldehyde or acetaldehyde. In addition, preferred examples further include sulfonates such as p-toluenesulfonate, dodecylbenzenesulfonate and 2-methoxy-4-hydroxy-5-benzoylbenzenesulfonate, phosphinates such as benzenephosphinate, salts with hydroxyl group-containing organic compounds such as 2,4-dihydroxybenzophenone salts and organic carboxylates of a condensate of p-diazodiphenylamine and formaldehyde as disclosed in U.S. Pat. No. 3,300,309.

Moreover, compounds obtained by condensing 3-methoxy-4-diazodiphenylamine with 4,4'-bis-methoxymethyldiphenyl ether and by converting the condensate to a mesitylenesulfonate salt as disclosed in Canadian Patent No. 1,172,492 are also suitable.

The amount of these diazonium compounds to be incorporated into the photosensitive composition generally ranges from 1 to 50% by weight, preferably 3 to 20% by weight on the basis of the total weight of the composition. These diazonium compounds may optionally be used in combination.

The polyurethane resin preferably used in the present invention is those having a phosphonic acid group, a phosphoric acid group and/or ester groups thereof mainly in the main chain. If necessary, the polyurethane resin may further contain a carboxyl group.

Preferred polyurethane resins include those comprising, as a basic structure, a reaction product of a diisocyanate compound of the following general formula (I) with a diol compound having a phosphonic acid group, a phosphoric acid group or their alkyl or aryl ester groups of the following general formula (II), (III) or (IV):

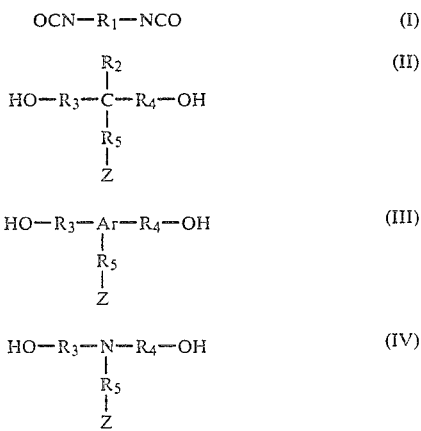

wherein
$R_1$ represents a divalent aliphatic or aromatic hydrocarbon group unsubstituted or substituted with a substituent (preferably an alkyl, aralkyl, aryl, alkoxy or halogeno group) and, if necessary, $R_1$ may have another functional group inert to the isocyanate group such as an ester, urethane, amido or ureido group, $R_2$ represents a hydrogen atom or an alkyl, aralkyl, aryl, alkoxy or aryloxy group which may be either unsubstituted or substituted with, for example, a cyano or nitro group, a halogen atom (—F, —Cl, —Br or —I), —CONH$_2$, —COOR$_6$, —OR$_6$, —NHCONHR$_6$, —NHCOOR$_6$, —NHCOR$_6$, —OCONHR$_6$ or —CONHR$_6$, $R_6$ being an alkyl group having 1 to 10 carbon atoms or an aralkyl group having 7 to 15 carbon atoms; preferably $R_2$ is a hydrogen atom, an alkyl group having 1 to 8 carbon atoms or an aryl group having 6 to 15 carbon atoms, $R_3$, $R_4$ and $R_5$ may be the same as or different from one another and each represents a single bond or a divalent aliphatic or aromatic hydrocarbon group which may be either unsubstituted or substituted with a substituent such as preferably an alkyl, aralkyl, aryl or alkoxy group or with a halogen atom; they are preferably an alkylene group having 1 to 20 carbon atoms or an arylene group having 6 to 15 carbon atoms, and more preferably an alkylene group having 1 to 8 carbon atoms; if necesary, $R_3$, $R_4$ and $R_5$ may contain a functional group which is inert to the isocyanate group such as a carbonyl, ester, urethane, amido, ureido or ether group; and two or three of $R_2$, $R_3$, $R_4$ and $R_5$ may be joined together to form a ring Ar represents a trivalent aromatic hydrocarbon group which may be either unsubstituted or substituted; and Ar is preferably an aromatic hydrocarbon group having 6 to 15 carbon atoms; and

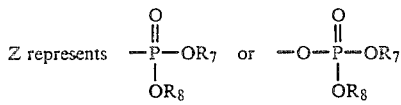

wherein $R_7$ and $R_8$ are either the same as or different from one another and each represents a hydrogen, sodium or potassium atom or an alkyl or aryl group; preferably $R_7$ and $R_8$ each represents a hydrogen atom, an alkyl group having 1 to 8 carbon atoms, or an aryl group having 6 to 15 carbon atoms.

The diisocyanate compounds of the general formula (I) include, for example, aromatic diisocyanate compounds such as 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; aliphatic diisocyanates such as hexamethylene diisocyanate, trimethylhexamethylene diisocyanate, lysine diisocyanate and dimer acid diisocyanates; alicyclic diisocyanate compounds such as isophorone diisocyanate, 4,4'-methylenebis(cyclohexyl isocyanate), methylcyclohexane-2,4-(or 2, 6-)diisocyanate and 1,3-(isocyanatomethyl)cyclohexane; and diisocyanate compounds obtained by reacting a diol with a diisocyanate such as an adduct of 1,3-butylene glycol and tolylene diisocyanate in a molar ratio of 1:2.

The diol compounds having a phosphonic acid group, a phosphoric acid group or their ester groups as represented by the general formulae (II), (III) and (IV) are produced by, for example, processes which will be described below.

In one of the processes, a hydroxyl group of a halogen compound represented by the following general formula (V), (VI) or (VII) is protected, if necessary, then the compound is converted into its phosphonate ester by Michaelis-Arbuzov reaction represented by the following formula (VIII) and, if necessary, the resulting ester is hydrolyzed with hydrogen bromide or the like.

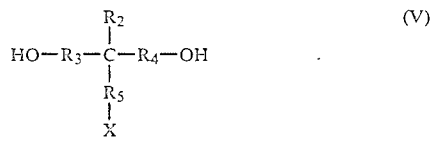

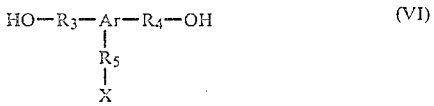

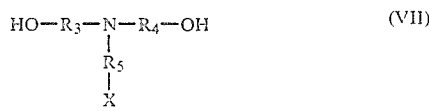

-continued

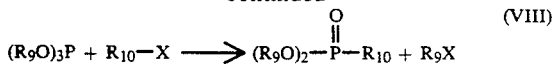

In the above formulae:

$R_2$, $R_3$, $R_4$, $R_5$ and Ar are the same as defined in the above formula (II), (III) or (IV);

$R_9$ represents an alkyl group or aryl group, preferably an alkyl group having 1 to 8 carbon atoms or aryl group having 6 to 15 carbon atoms, $R_{10}$ represents a group formed by eliminating X from the compound of the formula (V), (VI) or (VII), X represents a halogen atom, preferably Cl, Br or I.

Another process for producing the diol compounds comprises reacting a compound of the formula: $R_{10}$—OH with phosphorus oxychloride and hydrolyzing the reaction product to obtain the diol compound (IX) as shown by the following formula:

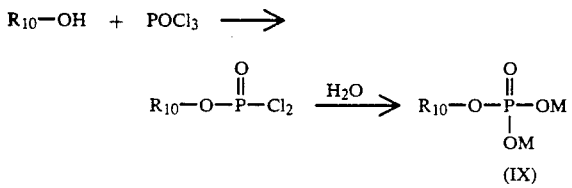

wherein $R_{10}$ is the same as defined in the formula (VIII) and M represents a hydrogen, sodium or potassium atom.

The polyurethane resin having a phosphonic acid group can be produced by reacting a diisocyanate compound of the general formula (I) with a diol compound having a phosphonic acid ester group of the general formula (II), (III) or (IV) to form a polyurethane resin and then hydrolyzing it with hydrogen bromide or the like.

The carboxyl group can be introduced, if necessary, into the polyurethane resin of the present invention by, for example, using a diol compound having a carboxyl group as represented by the following general formula (X), (XI) or (XII) in combination with a diol compound of the above general formula (II), (III) or (IV):

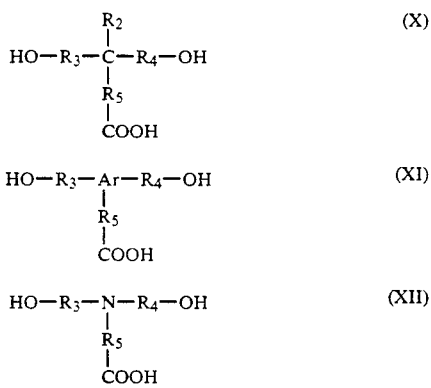

wherein $R_2$, $R_3$, $R_4$, $R_5$ and Ar are the same as defined in the general formula (II), (III) or (IV).

The diol compounds having a carboxyl group and represented by the general formula (X), (XI) or (XII) include, for example, 3,5-dihydroxybenzoic acid, 2,2-bis(hydroxymethyl)propionic acid, 2,2-bis(2-hydroxyethyl)propionic acid, 2,2-bis(3-hydroxypropyl) propionic acid, bis(hydroxymethyl)acetic acid, bis(4-hydroxyphenyl)acetic acid, 4,4-bis(4-hydroxyphenyl)pentanoic acid, tartaric acid, N,N-dihydroxy-ethylglycine and N,N-bis(2-hydroxyethyl)-3-carboxypropionamide.

The polyurethane resin of the present invention can be produced from a diisocyanate compound of the general formula (I), two or more of the diol compounds of the general formulae (II), (III) and (IV) and two or more of the diol compounds of the general formulae (X), (XI) and (XII).

A diol compound different from those of the above general formulae (II), (III), (IV), (X), (XI) and (XII) can be used in combination of the above-described diol compounds so far as the alkali developability is not impaired.

Such diol compounds include, for example, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,4-butanediol, 1,5-pentanediol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol, ethylene oxide adduct of hydrogenated bisphenol A, propylene oxide adduct of hydrogenated bisphenol A, hydroquinone dihydroxyethyl ether, p-xylylene glycol, dihydroxyethylsulfone, bis(2-hydroxyethyl)-2,4-tolylene dicarbamate, 2,4-tolylenebis-(2-hydroxyethylcarbamide) and bis(2-hydroxyethyl)-m-xylylene dicarbamate.

The polyurethane resin of the present invention is produced by heating the above-described diisocyanate compound and diol compound in the presence of a known active catalyst selected suitably for the reactivity of the reactants in an aprotic solvent. The molar ratio of the diisocyanate to the diol compound used is preferably 0.8:1 to 1.2:1 When an isocyanate group remains at an end of the polymer, it is treated with an alcohol or amine to obtain the final product free from the isocyanate group.

The weight-average molecular weight of the polyurethane resin of the present invention is preferably at least 1,000, more preferably in the range of 5,000 to 200,000.

The polyurethane resins may be used either singly or in the form of a mixture thereof. The polyurethane resin content of the photosensitive composition is about 50 to 99.5% by weight, preferably about 55 to 95% by weight.

The photosensitive composition of the present invention may contain other resin or resins in an amount of not more than 50% of the polyurethane resin. Examples of such resin include polyamide resin, epoxy resin, polyacetal resin, acryl resin, methacryl resin, polystyrene resin and novolak type phenol resin.

The photosensitive composition of the present invention may optionally comprise other additives such as dyes, pigments, stabilizers, fillers, surfactants, plasticizers and the like to improve various properties of the composition.

As the dyes or pigments for dying images, there may be mentioned oil-soluble dyes and basic dyes such as Oil Yellow #101, Oil Yellow #130, Oil Pink #312, Oil Green BG, Oil Blue BOS, Oil Blue #603, Oil Black BY, Oil Black BS, Oil Black T-505 (these are available from ORIENT CHEMICAL INDUSTRIES, LTD.); Victoria Pure Blue, Crystal Violet (CI 42555), Methyl Violet (CI 42535), Rhodamine B (CI 45170B), Malachite Green (CI 42000) and Methylene Blue (CI 52015).

As examples of the stabilizer, there can be mentioned phosphoric acid, phosphorous acid, oxalic acid, p-toluenesulfonic acid, dipicolinic acid, malic acid, tartaric acid, 2-methoxy-4-hydroxy-5-benzoylbenzenesulfonic acid, butylnaphtharenesulfonic acid, p-hydroxybenzenesulfonic acid and the like.

The composition of the present invention is dissolved in a solvent in which the above ingredients are soluble, and the solution is applied to a support. The solvents usable herein include, for example, methanol, ethanol, isopropanol, n-butanol, t-butanol, ethylene dichloride, cyclohexanone, methyl ethyl ketone, ethylene glycol, ethylene glycol monomethyl ether, ethylene glycol monoethyl ether, 2-methoxyethyl acetate, 1-methoxy-2-propanol, 1-methoxy-2-propyl acetate, methyl lactate, ethyl lactate, N,N-dimethylformamide, N,N-dimethylacetamide, $\gamma$-butyrolactone, N-methylpyrrolidone, tetramethylurea, tetrahydrofuran, dioxane, dimethyl sulfoxide, sulfolane, toluene and ethyl acetate. These solvents are used either singly or in the form of a mixture thereof. The concentration (solid content) of the solution is 2 to 50% by weight. The amount of the solution to be applied to the support varies depending on the use of the composition. For example, in the production of a photosensitive lithographic plate, the amount of the coating is usually and preferably 0.5 to 3.0 g/m$^2$ (in terms of the solid). As the coating amount is reduced, the photosensitivity is increased, but the physical properties of the photosensitive layer are impaired.

Examples of the support include paper; paper laminated with a plastics such as polyethylene, polypropylene and polystyrene; metal sheets such as aluminum (including also aluminum alloys), zinc and copper sheets; plastic films such as cellulose diacetate, cellulose triacetate, cellulose propionate, cellulose butyrate, celulose acetate butyrate, cellulose nitrate, polyethylene terephthalate, polyethylene, polystyrene, polypropylene, polycarbonate and polyvinyl acetal; and paper and plastic films having a coating film of the above-described metal formed by lamination or vacuum deposition. Among these supports, an aluminum sheet is particularly preferred, because it has a quite high dimensional stability and is inexpensive. Further, a composite film comprising a polyethylene terephthalate film having an aluminum sheet bonded therewith as described in British Patent No. 1,392,714 is also preferred.

When the support has a metallic surface, particularly a aluminum surface, it is preferably surface-treated by graining, by immersion in an aqueous solution of sodium silicate, potassium fluorozirconate or a phosphoric acid salt or by anodic oxidation. Further, preferred supports include an aluminum plate immersed in an aqueous sodium silicate solution as described in U.S. Pat. No. 2,714,066, an aluminum plate anodically oxidized and then immersed in an aqueous alkali metal silicate solution as described in U.S. Pat. No. 3,181,461 and an aluminum support processed by a combination of a mechanical surface roughening with electrolytic surface roughening, as described in U.S. Pat. No. 4,476,006. The anodic oxidation is conducted by applying an electric current by using the aluminum plate as an anode in an electrolytic solution comprising an aqueous or non-aqueous solution of an inorganic acid such as phosphoric acid, chromic acid, sulfuric acid or boric acid or an organic acid such as oxalic acid or sulfamic acid or a salt thereof. These solutions can be used either singly or in combination of two or more of them.

The support which has been subjected to a sealing process after the graining or anodic oxidation is also preferred. The sealing is conducted by immersing the support in an aqueous sodium silicate solution, hot water or hot aqueous solution of an inorganic or organic salt, or by means of a steam bath.

Further, the electrodeposition with a silicate as described in U.S. Pat. No 3,658,662 is also effective.

The photosensitive composition of the present invention thus applied to the support is exposed through a transparent original image such as a line image or half-tone dot image, and then developed with an aqueous alkali developer to obtain a relief image negative to the original image.

The light sources usable for the exposure include a carbon arc lamp, mercury lamp, xenone lamp, tungsten lamp and metal halide lamp.

Examples of developers used for developing the presensitized printing plate having a layer of the composition of the present invention include weak alkaline aqueous solutions such as those composed of water, an organic solvent having a solubility in water not more than 10% by weight at room temperature (e.g., benzyl alcohol and ethylene glycol monophenyl ether), an alkaline agent (e.g., triethanolamine and monoethanolamine), an anionic surfactant (e.g., aromatic sulfonic acid salts, dialkylsulfosuccinic acid salts, alkylnaphthalenesulfonic acid salts, surfactants represented by the following general formulae;

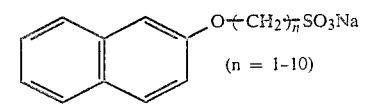

(n = 1-10)

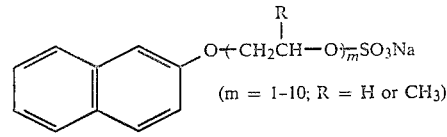

(m = 1-10; R = H or CH$_3$)

and branched alkylsulfuric acid ester salts), and those composed of water, optionally contamination inhibiting agents (e.g., sodium sulfite and sodium salt of sulfopyrazolone) and agent for softening hard water (e.g., tetrasodium ethylenediaminetetra acetate, a compound represented by the formula; N(CH$_2$COONa)$_3$ and ethylenediamine-tetra(methylenephosphonic acid)).

The photosensitive composition of the present invention exhibits an excellent coating properties when it is applied to the support. After the coating followed by drying and imagewise exposure, it exhibits an excellent developability when the exposed area is developed with the aqueous alkali developer. The relief image thus obtained has an excellent adhesion to the support and when it is used as a printing plate, a great number of prints can be obtained.

EXAMPLES

The following Synthetic Examples and Examples will furhter illustrate the present invention, which by no means limit the scope of the present invention.

SYNTHETIC EXAMPLE 1

4.4 g (0.022 mol) of N,N-bis-(2-hydroxyethyl-)aminomethylphosphonic acid of the formula:

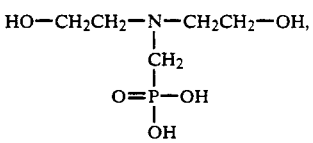

8.9 g (0.066 mol) of 2,2-bis(hydroxymethyl)propionic acid, 5.0 g (0.055 mol) of 1.4-butanediol and 6.1 g (0.057 mol) of diethylene glycol were dissolved in 100 g of N,N-dimethylacetamide in a 500 ml three-necked round-bottom flask provided with a condenser and a stirrer. 31.6 g (0.126 mol) of 4,4'-diphenylmethane diisocyanate and 14.1 g (0.084 mol) of hexamethylene diisocyanate were added thereto and then 0.1 g of dibutyltin dilaurate (catalyst) was added thereto. They were stirred under heating at 100° C. for 6 hours. Then the reaction product was diluted with 100 ml of N,N-dimethylformamide and 150 ml of methanol. The reaction mixture was added to 6 l of water under stirring to precipitate a white polymer. It was taken by filtration, washed with water and dried in vacuo to give 67 g of the polymer.

The molecular weight of the polymer was determined by gel permeation chromatography (GPC) to reveal that the weight average molecular weight was 21,000 (standerd: polystyrene). The acid value of the product determined by titration was 1.17 meq/g [Polyurethane resin (a) of the present invention].

SYNTHETIC EXAMPLE 2

11.5 g (0.045 mol) of diethyl N,N-bis(2-hydroxyethyl) aminomethylphosphonate of the following formula:

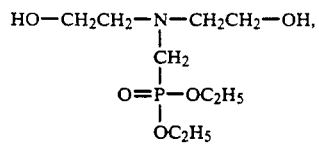

6.1 g (0.045 mol) of 2,2-bis(hydroxymethyl)propionic acid, 4.0 g (0.044 mol) of 1,4-butanediol and 7.0 g (0.066 mol) of diethylene glycol were dissolved in 120 g of N,N-dimethylacetamide in a 500 ml three-necked round-bottom flask provided with a condenser and a stirrer. 31.6 g (0.126 mol) of 4,4'-diphenylmethane diisocyanate and 18.7 g (0.084 mol) of isophorone diisocyanate were added to the solution, and then 0.1 g of dibutyltin dilaurate (catalyst) was added thereto. They were stirred under heating at 100° C. for 4 hours. Then the same procedure as that of Synthetic Example 1 was repeated to give 75 g of a white polymer.

The molecular weight of the polymer was determined by GPC (standard: polystyrene) to reveal that the weight average molecular weight was 55,000. The acid value of the product determined by titration was 0.53 meq/g [Polyurethane resin (b) of the present invention].

SYNTHETIC EXAMPLE 3

20 g of the Polyurethane resin (b) of the present invention produced in Synthetic Example 2 was dissolved in 200 ml of N,N-dimethylacetamide/acetic acid (1:1). 8.6 g (0.050 mol) of a 47% aqueous hydrogen bromide solution was added thereto and the mixture was stirred under heating at 80° C. for 2 hours. The reaction mixture was added to 4 l of water under stirring, to precipitate a white polymer. The polymer was taken by filtration, washed with water and dried in vacuo to give 17 g of the polymer.

It was confirmed by NMR analysis that diethyl phosphonate had been hydrolyzed into phosphonic acid. The acid value of the product determined by titration was 1.20 meq/g. The conversion into phosphonic acid calculated from the acid value was about 86% [Polyurethane resin (c) of the present invention].

SYNTHETIC EXAMPLES 4 TO 16

Polyurethane resins of the present invention were produced from diisocyanate compounds and diol compounds shown in Table 1 below in the same manner as that of Synthetic Example 1, 2 or 3.

The molecular weight of the product was determined by GPC and the acid value was determined by titration. The acid values are also shown in Table 1. The weight average molecular weights of the products ranged from 20,000 to 65,000 (standard: polystyrene).

TABLE 1

| Poly-urethane resin | Diisocyanate compound (mole %) | Diol compound(s) having a phosphonic acid group, a phosphoric acid group and/or ester groups thereof (mole %) | Other diol compound(s) (mole %) | Acid Value (meq/g) |
|---|---|---|---|---|
| (d) | OCN—H$_2$C—C$_6$H$_4$—CH$_2$—NCO (100) | HO—CH$_2$CH$_2$—N(—CH$_2$CH$_2$—OH)(—CH$_2$CH$_2$—OH) with CH$_2$—P(=O)(OH)(OC$_2$H$_5$) side chain (30) + HO—CH$_2$CH$_2$—N(—CH$_2$CH$_2$—OH)(—CH$_2$CH$_2$—OH) with CH$_2$—P(=O)(OC$_2$H$_5$)(OC$_2$H$_5$) side chain | HO—CH$_2$—C(CH$_3$)(COOH)—CH$_2$—OH (30) + HO—(CH$_2$)$_6$—OH (40) | 1.45 |
| (e) | OCN—C$_6$H$_4$—CH$_2$—C$_6$H$_4$—NCO (60) + OCN—H$_2$C—C$_6$H$_4$—CH$_2$—NCO (40) | HO—CH$_2$CH$_2$—N(—CH$_2$CH$_2$—OH)(—CH$_2$CH$_2$—OH) with CH$_2$—P(=O)(OH)(OC$_2$H$_5$) (20) | HO—CH$_2$—C(CH$_3$)(COOH)—CH$_2$—OH (35) + HO—CH$_2$CH$_2$—SO$_2$—CH$_2$CH$_2$—OH (45) | 1.24 |
| (f) | H$_3$C—C$_6$H$_3$(NCO)—C$_6$H$_3$(CH$_3$)—NCO (100) | HO—CH$_2$CH$_2$—N(—CH$_2$CH$_2$—OH)(—CH$_2$CH$_2$—OH) with CH$_2$—P(=O)(OC$_2$H$_5$)(OC$_2$H$_5$) (25) | HO—CH$_2$—C(CH$_3$)(COOH)—CH$_2$—OH (30) + HO—(CH$_2$)$_4$—OH (20) + HO—(CH$_2$CH$_2$—O)$_7$H (25) | 1.16 |
| (g) | naphthalene-1,5-diyl bis-NCO (100) | HO—CH$_2$CH$_2$—N(—CH$_2$CH$_2$—OH)(—CH$_2$CH$_2$—OH) (30) + HO—CH$_2$CHCH$_2$—N with O=P(OH)(OH) group and OC$_2$H$_5$ substituent | HO—CH$_2$CH$_2$—N(—CH$_2$CH$_2$—OH)(—CH$_2$CH$_2$—OH) with C=O, CH$_2$CH$_2$COOH side (35) + HO—(CH$_2$)$_5$—OH (20) + HO—(CH$_2$CH$_2$—O)$_7$H (35) | 1.19 |
| (h) | OCN—C$_6$H$_3$(CH$_3$)—N(CO)$_2$N—C$_6$H$_3$(CH$_3$)—NCO (50) + OCN—(CH$_2$)$_6$—NCO (50) | | HO—CH$_2$—C(CH$_3$)(COOH)—CH$_2$—OH (25) + HO—(CH$_2$)$_5$—OH (20) + HO—(CH$_2$CH$_2$—O)$_7$H (25) | 1.20 |

TABLE 1-continued

| Poly-urethane resin | Diisocyanate compound (mole %) | Diol compound(s) having a phosphonic acid group, a phosphoric acid group and/or ester groups thereof (mole %) | Other diol compound(s) (mole %) | Acid Value (meq/g) |
|---|---|---|---|---|
| (m) | OCN—⟨C₆H₄⟩—CH₂—⟨C₆H₄⟩—NCO (70) + OCN—(CH₂)₆—NCO (30) | HO—CH₂CHCH₂—OH, O—P(=O)(OH)₂ (15) | HO—CH₂—C(CH₃)(COOH)—CH₂—OH (30) + HO—(CH₂)₇—OH (25) + HO—(CH₂CH₂—O)₇H (36) | 1.21 |
| (n) | OCN—⟨C₆H₄⟩—CH₂—⟨C₆H₄⟩—NCO (70) + H₃C—C(CH₃)(CH₂—NCO)—C₆H₉—CH₃—NCO (isophorone diisocyanate) (30) | HO—CH₂CHCH₂—OH, O—P(=O)(OH)₂ (20) | HO—CH₂—C(CH₃)(COOH)—CH₂—OH (35) + HO—CH₂—CH=CH—CH₂—OH (45) | 1.50 |
| (o) | OCN—naphthalene—NCO (1,5-naphthalene diisocyanate) (60) + OCN—(CH₂)₆—NCO (40) | HO—CH₂CH(CH₂—O—P(=O)(OH)₂)—OH (15) | HO—CH₂—C(CH₃)(COOH)—CH₂—OH (40) + HO—CH₂CH₂—SO₂—CH₂CH₂—OH (45) | 1.53 |
| (p) | OCN—⟨C₆H₄⟩—CH₂—⟨C₆H₄⟩—NCO (60) + OCN—(CH₂)₆—NCO (40) | HO—CH₂CH₂—N(CH₂—P(=O)(OH)₂)—CH₂CH₂—N(CH₂—P(=O)(OC₂H₅)₂)—CH₂CH₂—OH (30) | HO—(CH₂)₇—OH (25) + HO—(CH₂CH₂—O)₇H (35) | 0.85 |

The polyurethane resins (d), (e), (f), (h), (i), (j), (l) and (p) of the present invention shown in Table 1 were produced by the process of Synthetic Example 2 or 3 and the remaining resins were produced by the process of Synthetic Example 1.

EXAMPLES 1 TO 9

The surface of an aluminum plate having a thickness of 0.24 mm was grained with a nylon brush and an aqueous suspension of a pumice powder having a size of 400 mesh and then thoroughly washed with water. The plate was etched by immersion in a 10% sodium hydroxide solution at 70° C. for 60 seconds, washed with running water, neutralized with 20% $HNO_3$ and washed with water. The surface was roughened by the electrochemical graining method as disclosed in Japanese Patent Un-examined Publication (KOKAI) No. Sho 53-67507, i.e., by electrolysis in a 1% aqueous nitric acid solution using alternating sinusoidal current under conditions comprising $V_A$ of 12.7 V, $V_C$ of 9.1 V and the quantity of electricity at the anode time of 160 coulombs/$dm^2$. The plate was then immersed in a 30% aqueous $H_2SO_4$ solution and desmutted at 55° C. for 2 minutes and then subjected to anodic oxidation in a 7% aqueous $H_2SO_4$ solution so as to give a coated aluminium oxide amount of 2.0 g/$m^2$. Then, the plate was immersed in a 3% aqueous solution of sodium silicate at 70° C. for 1 minute, washed with water and dried.

Nine varieties photosensitive compositions, Photosensitive Compositions [A]-1 to [A]-9, were prepared by using various polyurethane resins listed in Table 2 below according to the following composition. Each of the photosensitive compositions was applied to the resultant aluminum plate and dried at 80° C. for 2 minutes to produce Photosensitive Lithographic Plates [A]-1 to [A]-9. The amount of the composition thus applied was 2.0 g/$m^2$ (on dry basis).

| Photosensitive composition | |
|---|---|
| 4-n-Dodecylbebzenesulphonate salt of 4-diazolhenylamine/formaldehyde condensate | 0.5 g |
| Polyurethane resin of the present invention (Table 2) | 5.0 g |
| Oil-soluble dye (Victoria Pure Blue BOH) | 0.1 g |
| Malic acid | 0.05 g |
| 2-Methoxyethanol | 100 g |

For comparison, a photosensitive composition [B]-1 and [B]-2 containing the following polymers (1) and (2) respectively in place of the polyurethane resins of the present invention was applied to the support and dried in the same manner as that described above. The dry weight thereof was 2.0 g/$m^2$.

Polymers Used in Comparative Examples 1 and 2

(1) A polyurethane resin produced from the following compounds:

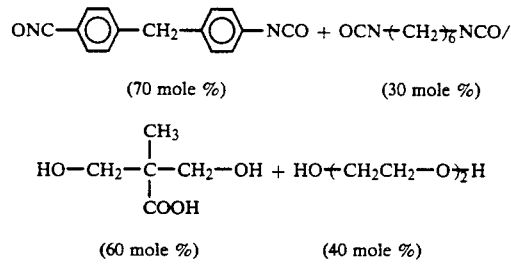

This polyurethane resin has an acid value of 1.64 meq/g and weight average molecular weight (standard: polystyrene) of 38,000 (this polymer is described in Table 1 of U.S. Pat. No. 4,983,491 as Polymer (L)).

(2) A polyurethane resin produced by reacting ethylene bromohydrin with a polymer obtained from the following compounds:

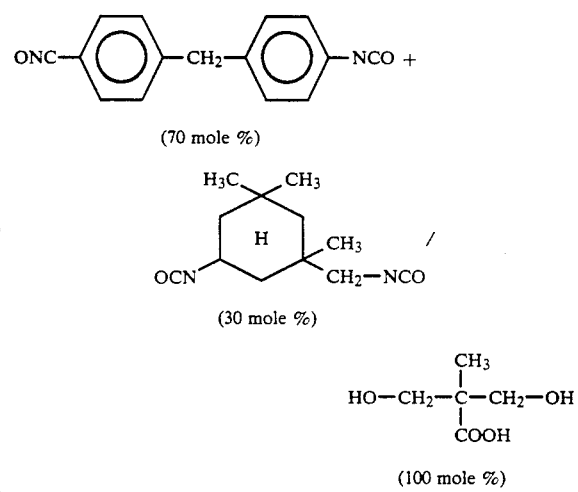

and by partially esterifying the carboxyl groups of the resulted polymer to produce hydroxyethyl ester groups.

This polyurethane resin has an acid value of 1.25 meq/g and average molecular weight of 35,000 (this polymer is described in Table 2 of U.S. Pat. No. 4,984,491 as Polymer (1)).

Photosensitive lithographic plates [A]-1 to [A]-9, [B]-1 and [B]-2 produced from the photosensitive compositions [A]-1 to [A]-9, [B]-1 and [B]-2, respectively, were immersed in warm water at 40° C. for 60 minutes. Then, the surface of the photosensitive layer of each plate was dried and a commercially available adhesive tape (Nitto Tape) wa applied thereto. The tape was peeled off and the degree of peeling of the photosensitive layer from the aluminum support was examined. The results are shown in Table 2.

TABLE 2

| Photosensitive lithographic plate | Polymer used | Peeling of photosensitive layer |
|---|---|---|
| [A]-1 Example 1 | Polyurethane resin (a) of the present invention | Not peeled |
| [A]-2 Example 2 | Polyurethane resin (c) of the present invention | Not peeled |
| [A]-3 Example 3 | Polyurethane resin (e) of the present invention | Not peeled |
| [A]-4 Example 4 | Polyurethane resin (f) of the present invention | Not peeled |
| [A]-5 Example 5 | Polyurethane resin (i) of the present invention | Not peeled |
| [A]-6 Example 6 | Polyurethane resin (j) of the present invention | Not peeled |
| [A]-7 Example 7 | Polyurethane resin (l) of the present invention | Not peeled |
| [A]-8 Example 8 | Polyurethane resin (m) of the present invention | Not peeled |

TABLE 2-continued

| Photosensitive lithographic plate | Polymer used | Peeling of photosensitive layer |
|---|---|---|
| [A]-9 Example 9 | Polyurethane resin (p) of the present invention | Not peeled |
| [B]-1 Comparative Example 1 | Polymer in comparative Example 1 | Peeling of more than 80% |
| [B]-2 Comparative Example 2 | Polymer in comparative Example 2 | Peeling of more than 50% |

It is apparent from Table 2 that the photosensitive layer was not peeled off from Photosensitive Lithographic Plates [A]-1 to [A]-9 containing the polyurethane resin of the present invention and the adhesion of the photosensitve layer to the support observed in Plates [A]-1 to [A]-9 was quite excellent unlike that observed in Photosensitive Lithographic Plates [B]-1 and [B]-2 of Comparative Examples 1 and 2.

Then, a printing test was carried out by using Photosensitive Lithographic Plates [A]-1 to [A]-8 and a comparative plate, Photosensitive Lithographic Plate [C](Comparative Example 3), as follows.

Photosensitive Lithographic Plate [C] was obtained by applying a photosensitive composition the same as used in Examples 1 to 9 except that it contains a polymer described below in place of the polyurethane resins of the present invention to the support the same as used in Examples 1 to 9. The amount of the coating film after drying was 2.0 g/m².

Polymer used in Photosensitive Lithographic Plate [C]
A polymer represented by the following structure:

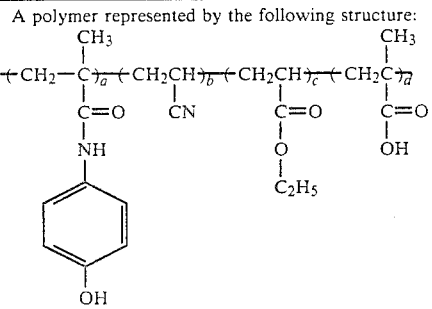

wherein the molar ratio of the a:b:c:d is 9:24:58:9 having a weight average molecular weight of 55,000 (standard: polystyrene).

A negative transparent original was closely placed on each of Photosensitive Lithographic Plates [A]-1 to [A]-8 and [C] and then imagewise exposed to light of PS Light (a product of Fuji Photo Film Co., Ltd.) at a distance of 1 m for 1 minute.

The exposed Photosensitive Lithographic Plates []]-1 to [A]-8 and [C] were immersed in a developer having the composition shown below at room temperature for 1 minute. Then, the unexposed areas were removed by rightly rubbing the surface with absorbent cotton to obtain Lithographic Plates [A]-1 to [A]-8 and [C] having light blue images.

| Developer | |
|---|---|
| Sodium sulfite | 5 g |
| Benzyl alcohol | 30 g |
| Sodium carbonate | 5 g |
| Sodium isopropylnaphthalenesulfonate | 12 g |
| Water | 1000 g |

Thus obtained Lithographic Printing Plates [A]-1 to [A]-8 and [C] were used for producing prints by using wood free papers with a commercially available ink by means of KOR printing machine of Heidelberg Co. The numbers of the prints produced with Lithographic Plates [A]-1 to [A]-8 and [C]were as shown in Table 3.

TABLE 3

| Photosensitive lithographic plate | Polymer used | Number of prints produced |
|---|---|---|
| [A]-1 Example 1 | Polyurethane resin (a) of the present invention | 170,000 |
| [A]-2 Example 2 | Polyurethane resin (c) of the present invention | 180,000 |
| [A]-3 Example 3 | Polyurethane resin (e) of the present invention | 165,000 |
| [A]-4 Example 4 | Polyurethane resin (f) of the present invention | 170,000 |
| [A]-5 Example 5 | Polyurethane resin (i) of the present invention | 190,000 |
| [A]-6 Example 6 | Polyurethane resin (j) of the present invention | 170,000 |
| [A]-7 Example 7 | Polyurethane resin (l) of the present invention | 180,000 |
| [A]-8 Example 8 | Polyurethane resin (m) of the present invention | 160,000 |
| [C] Comparative Example 3 | Polymer in comparative Example 3 | 85,000 |

What is claimed is:

1. A photosensitive composition comprising, in admixture, 1 to 50% by weight of a light-sensitive diazonium compound, and 50 to 99.5% by weight of a polyurethane resin binder, based on the total weight of the composition, wherein said polyurethane resin comprises, as a basic structure, a structure of a reaction product of at least one diisocyanate compound selected from the group of compounds represented by formula (I), with at least one diol compound selected from the group of compounds represented by general formulae (II), (III) and (IV):

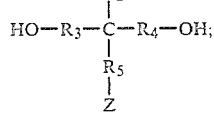

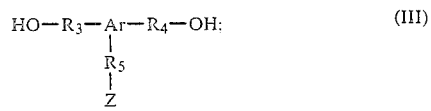

and

-continued

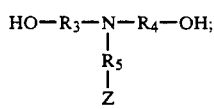   (IV)

wherein:
- R₁ represents a divalent aliphatic or aromatic hydrocarbon group unsubstituted or substituted with an alkyl, aralkyl, aryl, alkoxy or halogeno group, with the proviso that if necessary R₁ may have another functional group which is inert to the isocyanate group;
- R₂ represents a hydrogen atom, or an alkyl, aralkyl, aryl, alkoxy or aryloxy group which may be unsubstituted or substituted with a cyano or nitro group, a halogen atom, —CONH₂, —COOR₆, —OR₆, —NHCONHR₆, —NHCOOR₆, —NHCOR₆, —OCONHR₆ or —CONHR₆, R₆ being an alkyl group having 1 to 10 carbon atoms or an aralkyl group having 7 to 15 carbon atoms;
- R₃, R₄ and R₅ may be the same as, or different from, each other and each represents a single bond or a divalent aliphatic or aromatic hydrocarbon group which may be unsubstituted or substituted with an alkyl, aralkyl, aryl or alkoxy group or a halogen atom, with the proviso that if necessary R₃, R₄ and R₅ may contain a functional group which is inert to the isocyanate group, and two or three of R₂, R₃, R₄ and R₅ may be joined together to form a ring;
- Ar represents a trivalent aromatic hydrocarbon group unsubstituted or substituted; and Z represents 
$$-\overset{\overset{O}{\|}}{\underset{OR_8}{P}}-OR_7 \text{ or } -O-\overset{\overset{O}{\|}}{\underset{OR_8}{P}}-OR_7;$$

wherein R₇ and R₈ are the same as, or different from, each other and each represents a hydrogen, sodium or potassium atom or an alkyl or aryl group.

2. A photosensitive composition according to claim 1, wherein the diol compound(s) selected from those represented by formulae (II), (III) and (IV) is/are selected from one or more compounds from the group of N,N-bis(2-hydroxyethyl)aminomethylphosphonic acid, N,N-bis(2-hydroxyethyl)aminomethylphosphonate,

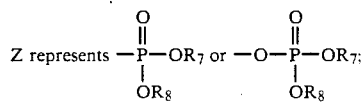

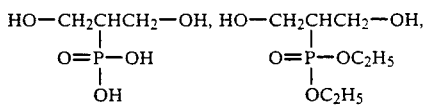

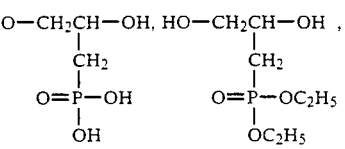

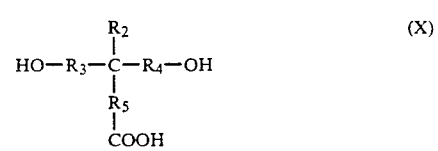

3. The composition of claim 1 wherein said R₂ represents a hydrogen atom, an alkyl group having 1 to 8 carbon atoms or an aryl group having 6 to 15 carbon atoms.

4. The composition of claim 1 wherein said R₃, R₄ or R₅ represents an alkylene group having 1 to 20 carbon atoms or an arylene group having 6 to 15 carbon atoms.

5. The composition of claim 4 wherein said R₃, R₄ or R₅ represents an alkylene group having 1 to 8 carbon atoms.

6. The composition of claim 1 wherein said Ar represents an aromatic hydrocarbon group having 6 to 15 carbon atoms.

7. The composition of claim 1 wherein said R₇ or R₈ represents a hydrogen atom, an alkyl group having 1 to 8 carbon atoms or an aryl group having 6 to 15 carbon atoms.

8. The composition of claim 1 wherein said diisocyanate compound is selected from the group consisting of 2,4-tolylene diisocyanate, 2,4-tolylene diisocyanate dimer, 2,6-tolylene diisocyanate, p-xylylene diisocyanate, m-xylylene diisocyanate, 4,4'-diphenylmethane diisocyanate, 1,5-naphthylene diisocyanate, 3,3'-dimethylbiphenyl-4,4'-diisocyanate, hexamethylene diisocyanate, trimethylhexamethylene diisocyanate, lysine diisocyanate, a dimer acid diisocyanate, isophorone diisocyanate, 4,4'-methylene bis(cyclohexyl isocyanate), methylcyclohexane-2,4-(or 2,6)-diisocyanate, 1,3-(isocyanatomethyl)cyclohexane and a diisocyanate compound of an adduct of 1,3-butylene glycol and tolylene diisocyanate in a molar ratio of 1:2.

9. The composition of claim 1 wherein said polyurethane resin has a carboxyl group.

10. The composition of claim 9 wherein said polyurethane resin comprises, as a basic structure, a reaction product of said diisocyanate compound, with said diol compound together with a diol compound having the following general formula (X), (XI) or (XII):

$$\underset{\underset{COOH}{|}}{\overset{\overset{R_2}{|}}{HO-R_3-\underset{\underset{}{|}}{\overset{\overset{}{|}}{C}}-R_4-OH}} \quad (X)$$
$$\phantom{HO-R_3-}R_5$$

-continued

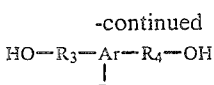   (XI)

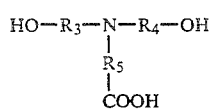   (XII)

wherein $R_2$, $R_3$, $R_4$, $R_5$ and Ar are the same as defined in the general formula (II), (III) or (IV).

11. The composition of claim 10 wherein said diol compound having the general formula (X), (XI) or (XII) is selected from the group consisting of 3,5-dihydroxybenzoic acid, 2,2-bis(hydroxymethyl)propionic acid, 2,2-bis(2-hydroxyethyl) propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid, tartaric acid, N,N-dihydroxyethylglycine and N,N-bis(2-hydroxyethyl)-3-carboxypropionamide.

12. The composition of claim 1 wherein said polyurethane resin is contained in an amount of 55 to 95% by weight based on the total amount of the composition.

13. The composition of claim 1 wherein said diazonium compound is selected from diazo resins.

14. The composition of claim 13 wherein said diazonium compound is a condensate of an aromatic diazonium salt and an active carbonyl group-containing compound.

15. The composition of claim 13 wherein the diazo resin is selected from the group consisting of hexafluorophosphate, tetrafluoroborate and phosphate of a condensate of p-diazodiphenylamine and folmaldehyde or acetaldehyde; sulfonates, phosphinates, salts with hydroxyl group-containing organic compounds and organic carboxylates of a condensate of p-diazodiphenylamine and formaldehyde; and compounds obtained by condensing 3-methoxy-4-diazodiphenylamine with 4,4'-bis-methoxymethyldiphenyl ether and by converting the condensate to a mesitylenesulfonate salt.

16. A presensitized lithographic printing plate comprising a support having coated thereon with the photosensitive composition of claim 1.

* * * * *